United States Patent [19]

Jewell et al.

[11] Patent Number: 5,063,586

[45] Date of Patent: Nov. 5, 1991

[54] APPARATUS FOR SEMICONDUCTOR LITHOGRAPHY

[75] Inventors: Tanya E. Jewell, Bridgewater, N.J.; J. Michael Rodgers, Pasadena, Calif.

[73] Assignee: AT&T Bell Laboratories, Murray Hill, N.J.

[21] Appl. No.: 528,532

[22] Filed: May 30, 1990

Related U.S. Application Data

[63] Continuation-in-part of Ser. No. 420,967, Oct. 13, 1989, abandoned.

[51] Int. Cl.$^5$ .................... G21K 5/00; G02B 5/10
[52] U.S. Cl. ........................ 378/34; 378/35; 359/859
[58] Field of Search .................. 378/34, 35, 43; 350/620, 442, 444

[56] References Cited

U.S. PATENT DOCUMENTS 4,226,501 10/1980 Shafer .................................. 350/55

FOREIGN PATENT DOCUMENTS 0252734 1/1988 European Pat. Off. .............. 378/34

OTHER PUBLICATIONS

"Four-Mirror Unobscured Anastigmatic Telescopes with All-Spherical Surfaces", by D. R. Shafer, *Applied Optics*, vol. 17, No. 7, Apr. 1, 1978, pp. 1072-1074.

"Education-Invited Paper", by D. L. Ederer, and Optical Design I, Contributed Papers, by D. C. Sinclair, 1983 Annual Meeting—*Optical Society of America*, Oct. 18, 1983, p. 1881.

"Wide-Angle Flat-Image Unobscured Telescope with Four Spherical Mirrors", by D. Shafter, David Shafer Optical Design, Inc., Fairfield, Conn., 6 pages.

"Measurement of Soft X-ray Multilayer Mirror Reflectance at Normal Incidence Using Laser-Produced Plasmas", by J. A. Trail et al., *Applied Physics Letters*, 52(4), Jan. 25, 1988, pp. 269-271.

"Soft X-ray Reduction Lithography Using Multilayer Mirrors", by H. Kinoshita et al., presented at *33rd International Symposium on EIPB*, 1989, 23 pages.

"Soft X-ray Projection Lithography Using an X-ray Reduction Camera", by A. M. Hawryluk et al., *Journal Vacuum Science Technology*, B6(6), Nov./Dec. 1988, pp. 2162-2164.

"Evaporated Multilayer Dispersion Elements for Soft X-rays", by E. Spiller, IBM T. J. Watson Research Center, Yorktown Heights, N.Y., 1981, 7 pages.

*Primary Examiner*—Edward P. Westin
*Assistant Examiner*—Don Wong
*Attorney, Agent, or Firm*—E. E. Pacher

[57] ABSTRACT

Disclosed is apparatus, exemplarily semiconductor X-ray lithography apparatus, that comprises a novel projection system. In preferred embodiments the projection system is adapted for use with radiation of wavelength below about 30 nm. The system comprises four or more mirrors that form a finite conjugate "optical" system that is telecentric at the short conjugate. The mirrors can be selected such that an essentially flat, diffraction limited image is formed. The image field can be two-dimensional, exemplarily a 10×10 mm square, and the resolution over the image field can be higher than 0.25 μm.

Exemplarily, the "optical" system comprises, from long to short conjugate, a convex, a concave, a convex, and a concave mirror, with at least two of the mirrors being aspherics. The radius absolute values of the four mirrors are, in the above order and as a fraction of the system focal length, 2.20, 2.59, 2.51, and 2.13 all to within ±5%. Equivalently, the radii of the four mirrors are, in the same order, in the ratio of 1.00, 1.18, 1.14, and 0.97, all to within ±5%. The axial separations, in the same order and as a fraction of the system focal length, are 1.45, 1.47, 1.10, and 1.21, the last being the separation between the second concave mirror and the image, all within ±10%.

6 Claims, 6 Drawing Sheets

DESIGN PERFORMANCE ACROSS
THE IMAGE FIELD

PERFORMANCE IS SYMMETRIC
ABOUT CENTER LINE

RMS WAVEFRONT ERROR / 84% ENCIRCLED ENERGY DIAMETER
(IN WAVES)  (IN μm)

TOP VIEW

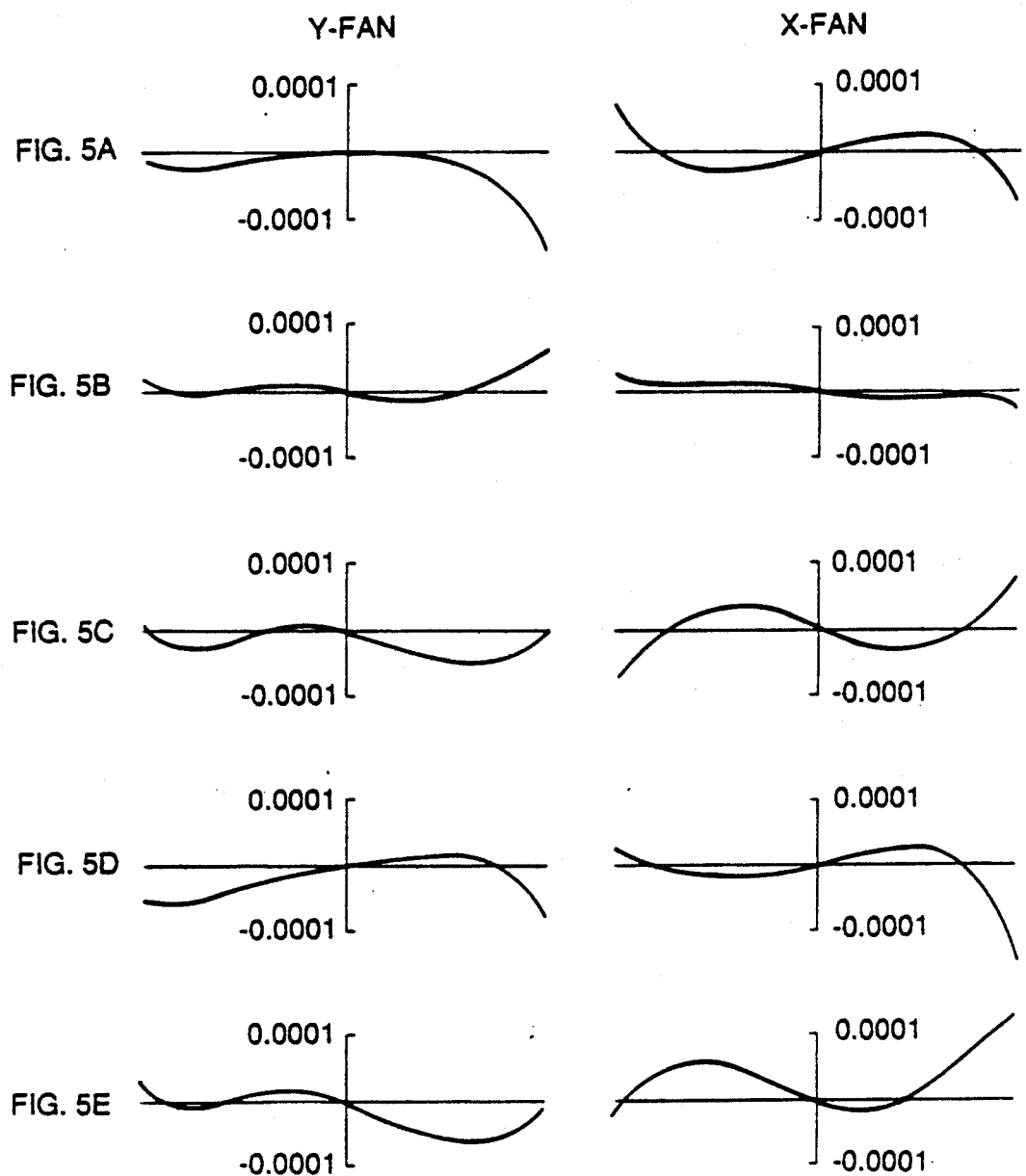

APPARATUS FOR SEMICONDUCTOR LITHOGRAPHY

This application is a continuation-in-part of application Ser. No. 420,967, filed on Oct. 13, 1989, now abandoned.

FIELD OF THE INVENTION

This invention pertains to apparatus for patterned exposure of a semiconductor member, or of a processing layer on a semiconductor member, to actinic radiation.

BACKGROUND OF THE INVENTION

Selective etching is part of essentially all currently known commercially significant methods for the manufacture of semiconductor devices, e.g., discrete or integrated electronic, opto-electronic, or optical semiconductor-based devices. Typically, selective etching is achieved by means of a suitably patterned processing layer that permits exposure of predetermined regions of a semiconductor member (frequently referred to as a "wafer") to an appropriate etching medium. The processing layer typically is patterned by a process that comprises exposure of predetermined regions of the layer to actinic radiation, whereby the chemical properties of the exposed processing layer material are altered, permitting selective removal of portions of the processing layer. This process generally is referred to as "lithography".

It is well known that individual semiconductor devices are being made progressively smaller, with the number of devices in integrated circuits (ICs) becoming progressively larger. Those skilled in the art generally speak of the size of a device in terms of the "design rule", a typical dimension of the device. Design rules of less than 1 $\mu$m are already commercialized, and it is anticipated that design rules of less than 0.5 $\mu$m will be used commercially within the next few years. It appears almost inevitable that the trend towards smaller and smaller devices will continue for some time to come, due to the technological and cost advantages that follow from the use of ICs that have larger and larger device counts. One of the technological advantages is higher speed due to shorter transit times of the carriers.

Currently the actinic radiation used in lithography is in the visible or UV part of the electromagnetic spectrum. As is well known, the obtainable feature size depends on the wavelength of the radiation used, with smaller design rules requiring the use of shorter wavelength actinic radiation for lithography. It is anticipated that current optical lithography techniques will not be usable for design rules below about 0.25 $\mu$m. Instead, it will be necessary to use actinic radiation of shorter wavelength. This could be particle beams, e.g., electron beams, or short wavelength electromagnetic radiation, namely, X-radiation. This application deals with apparatus for X-ray lithography.

Apparatus for conventional semiconductor lithography typically comprises a source of actinic radiation, refractive or catadioptric (i.e. containing both refractive and reflective elements) optics (using glass or quartz refractive elements) for conditioning the beam, and means for positioning a "mask" between the radiation source and the wafer that is to be exposed. Many commercially available optical lithography systems are of the step-and-repeat type. Such systems can be of the reducing or non-reducing type. In systems the former type the image feature size is smaller than the corresponding mask feature size, the size relationship being expressed in terms of the reduction ratio.

In view of the anticipated exceedingly small design rules it would be desirable to have available lithography apparatus of the reducing type, such that the mask features can be larger than the corresponding features on the wafer, making mask production easier. Furthermore, it would be desirable if the projection system of the apparatus had no image field curvature, such that both a flat mask and a flat wafer could be used. Still furthermore, it would be desirable if the projection system could produce a relatively large image field to avoid the need for scanning, and if the system could have resolution better than anticipated design rules over a relatively large two-dimensional image field. "Resolution" is defined herein as the minimum line width of a periodic square wave pattern which can be imaged by the projection system with contrast $\geq 0.65$. Finally, it would be highly desirable if the projection system were telecentric in the image space. By this is meant that the chief rays are parallel to each other in the image space. This generally greatly reduces the criticality of wafer positioning. This application discloses a novel X-ray lithography apparatus that can possess these and other desirable features.

The art knows several optical systems (generally four-mirror systems that were typically designed for use at optical or IR wavelengths) which have some of the attributes which are essential for an X-ray exposure system. However, no prior art system successfully meets all of the most important requirements. In particular, no prior art system overcomes the problems presented by the need for a wide (e.g., circular or square) image field that is telecentric in the image space. Among the chief shortcomings of the relevant prior art systems, in addition to the fact that they are designed for use at much longer wavelengths than those that are to be used in X-ray lithography, are the, typically, high aspect-ratio of their image field and/or their curvature of field. Because of these and other shortcomings, prior art systems are not appropriate for use in an X-ray lithography system of the type that is relevant to this application.

One example of a state-of-the-art unobscured four-mirror optical system is disclosed in U.S. Pat. No. 4,226,501, and D. R. Shafer, *Applied Optics*, Vol. 17(7), pp. 1072–1074. The prior art system combines a backwards Schwarzschild system with a known ring field system, resulting in a four mirror system with five reflections which is corrected for spherical aberration, coma, and astigmatism. However, in the prior art system the field curvature is not corrected. Furthermore, the prior art system is apparently designed for operation in the visible and/or IR part of the spectrum, has a rather small usable two-dimensional field, but can be used to provide a wide angle ring field or a moderately wide angle strip field.

Another example of a relevant four-mirror system is disclosed in abstract TuB3 of the 1983 Annual Meeting of the Optical Society of America. The author of the abstract is D. R. Shafer. The system described in the abstract is said to have a flat image field, in addition to being corrected for spherical aberration, coma and astigmatism. It is said to be well corrected for ring or strip image field shapes. The system is also a telescope system, and apparently is designed for use in the visible and/or IR part of the spectrum.

As is well known, a reflective optical system that is designed to meet certain performance criteria (e.g., a predetermined resolution over some given image field size) at a given wavelength can in general not be adapted for operation at a significantly shorter wavelength by mere dimensional scaling of the original design, since the usable field size will be scaled by the same factor as the wavelength. Thus, a design that meets certain resolution and aberration criteria (expressed as a fraction of the operating wavelength) at wavelength $\lambda$ over a certain size image field will in general not meet the same criteria (expressed as the same fraction of a new operating wavelength $\lambda'$) over the same size of the image field if $\lambda'$ is much shorter than $\lambda$ (e.g., $\lambda'/\lambda \lesssim 0.2$). For example, if an all reflective system has peak-to-valley wavefront aberration $\leq 0.25\lambda$ over a certain field size (such a system is well corrected and said to be diffraction-limited over the field size), the same system would have a wavefront aberration of $\leq 2.5\lambda'$, when operated at a wavelength $\lambda' = \lambda/10$. The system thus would not be well corrected for the shorter wavelength, and would not be diffraction limited.

SUMMARY OF THE INVENTION

In a broad aspect the invention is apparatus that comprises a four (or more)-mirror unobscured optical system. In preferred embodiments the optical system is adapted for use with X-rays, typically of wavelength less than about 30 nm. However, the invention is not so limited.

In a more particular aspect, the invention is an apparatus that comprises a four (or more)-mirror unobscured optical system which has a relatively wide, flat image field and is telecentric in image space, i.e., at the short conjugate.

In a particular embodiment, the apparatus is adapted for semiconductor lithography and comprises means for holding an essentially flat mask member that is to be exposed to process radiation during at least a part of the time the apparatus is in use. The apparatus further comprises means for holding a semiconductor member in predetermined relationship with respect to the mask member, and still further comprises projection system means that are adapted for forming a reduced size process radiation image of a predetermined region of the mask member on a surface of the semiconductor member, or on a processing layer disposed on the surface of the semiconductor member.

The projection system means comprise four or more mirrors that form a finite conjugate "optical" system that is telecentric at the short conjugate. The mirrors are selected such that the image of the predetermined region of the mask member is an essentially flat, typically diffraction limited image. The projection system means typically are adapted for use with process radiation of wavelength below about 30 nm.

Significantly, in preferred embodiments the image field of the projection system means has two dimensions, designated a and b, with $a \geq b$, $b \gtrsim 0.1a$, and $b \gtrsim 1$ mm, with the resolution over the image field being higher than about 0.25 $\mu$m.

In a still more particular embodiment the "optical" system comprises, from long to short conjugate, a first convex, a first concave, a second convex, and a second concave mirror. At least two of these mirrors are aspherics. The radii absolute values of the four mirrors are, again from long to short conjugate and as a fraction of the system focal length, 2.20, 2.59, 2.51, and 2.13, all to within $\pm 5\%$: Equivalently, the radii of the four mirrors are, in the same order, in the ratio of 1.00, 1.18, 1.14, and 0.97, all to within $\pm 5\%$. The axial separations of the mirrors, as a fraction of the system focal length, are 1.45 (first convex to first concave), 1.47 (first concave to second convex), 1.10 (second convex to second concave), and 1.21 (second concave mirror to image), all to within $\pm 10\%$. The "optical" system typically has a numerical aperture at the short conjugate of at least 0.07.

In particularly preferred embodiments of the invention the image reduction is at least 2:1, both a and b are at least 5 mm, and the resolution over the image field is higher than (i.e., is better than) 0.2 $\mu$m. Optionally, lithography apparatus according to the invention can comprise a source of processing radiation (e.g., a laser plasma X-ray source) and/or radiation filtering means.

BRIEF DESCRIPTION OF THE DRAWINGS

FIG. 5 shows 5 ray aberration plots for the same exemplary system as FIG. 4. The plots show image errors in y versus the relative pupil coordinate along the y meridian (left column), and image errors in the x-direction versus the relative pupil coordinate along the x meridian (right column), for five of the field points identified in FIG. 4;

Identical or analogous features in different figures are identified by the same numerals.

DETAILED DESCRIPTION OF SOME EXEMPLARY PREFERRED EMBODIMENTS

Figure 1:
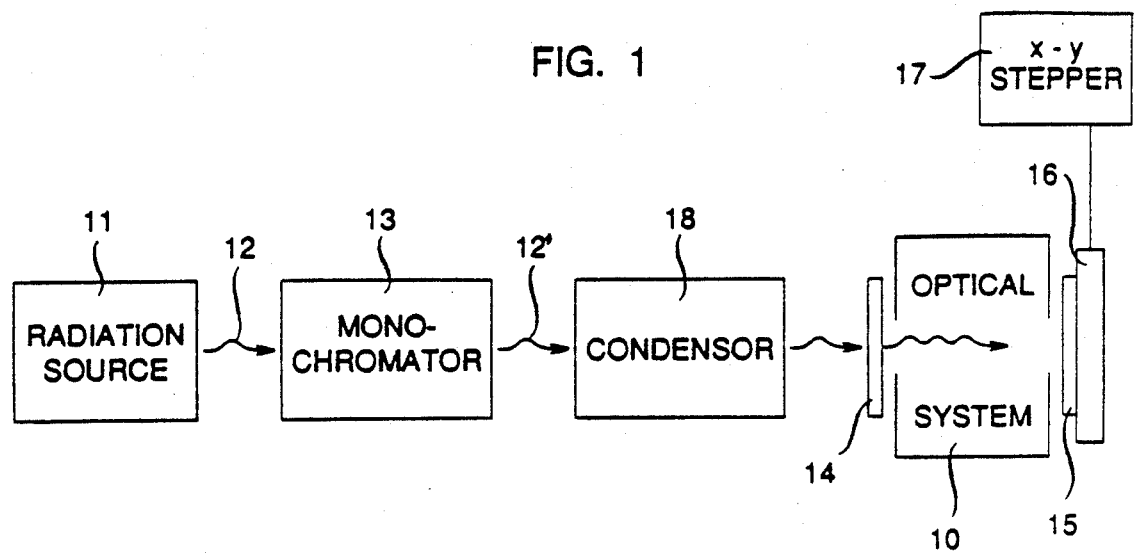
FIG. 1 schematically depicts the main elements of exemplary X-ray lithography apparatus according to the invention.

FIG. 1 schematically depicts exemplary inventive apparatus for semiconductor X-ray lithography. The apparatus comprises a radiation source 11 (exemplarily a synchrotron or a laser plasma source) that emits X-ray beam 12, typically a polychromatic beam. Optional filtering system 13 serves to narrow the spectral width of beam 12 such that a substantially monochromatic beam 12' results. Since, as will be discussed below, the inventive projection system is an all reflective system, use of a filtering system may not be always necessary. However, best resolution will generally be obtained if longer wavelengths are removed from the beam. Furthermore, by matching the spectral width of the incident radiation to the reflectivity bandwidth of the mirrors in the projection system, the stability of the system will typically be enhanced, since the mirrors will not have to carry the load of unwanted radiation.

The wavelength of the radiation (the processing radiation) that is incident on mask 14 typically is below about 30 nm, exemplarily about 13 nm. Since no optical material having high transmission for electromagnetic radiation wavelength less than about 100 nm is currently known, use of processing radiation of wavelength less than 30 nm requires that the projection system be an all reflective system.

The mask is maintained in a fixed relationship with optical system 10 by means that are not shown. Such means can be conventional and do not require detailed description. The optical system is an X-ray projection system according to the invention and comprises four (or possibly more) mirrors, at least two of which are aspheric, and will be described in detail below. The projection system causes the process radiation to be incident on a predetermined region of semiconductor wafer 15. Typically the surface of the wafer is covered with a processing layer (not shown) that comprises "resist" material that absorbs process radiation and consequently undergoes chemical changes.

The wafer 15 exemplarily is mounted on appropriate support means 16 and is held thereby in a fixed relationship with respect to the projection system. Typically the lithography apparatus also comprises x-y stepper means 17, or other means whereby, upon completion of exposure of a region (e.g., a 10×10 mm square) of the wafer, the wafer can be moved in a plane essentially normal to the X-ray beam, such that a different region of the wafer is brought into position for exposure. This technique is known as step-and-repeat and is well known to those skilled in the art. Means for carrying out the step-and-repeat process are also known and do not require detailed discussion. Systems according to the invention typically also comprise a condenser system 18 which serves to illuminate the mask uniformly and to image the source into the entrance pupil of the optical system 10.

FIG. 1 shows apparatus that comprises a mask of the transmission type. However, the invention is not so limited and can also be embodied in apparatus that use a mask of the reflective type. Those skilled in the art will be readily able to adapt the exemplary apparatus of FIG. 1 to accommodate a reflective mask.

Figure 2:
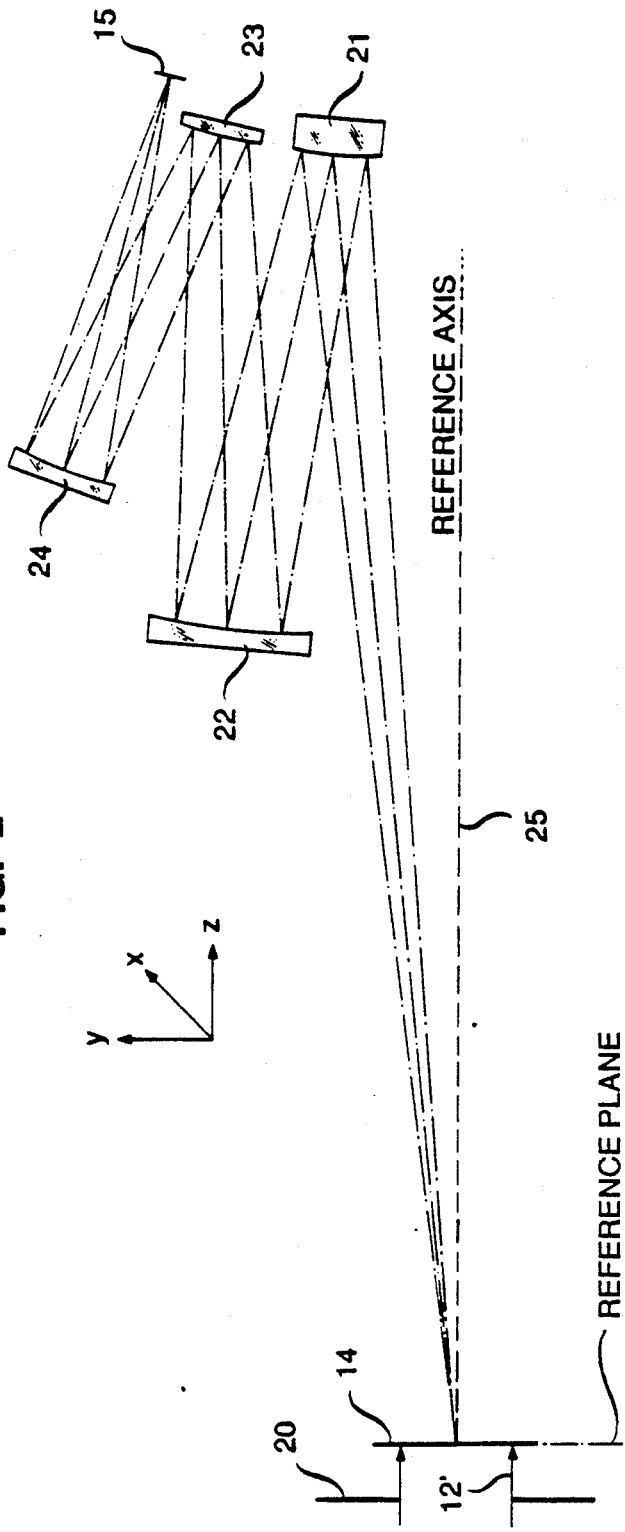
FIGS. 2 and 3 schematically show, in side view and top view, respectively, the relevant parts of an exemplary inventive projection system from mask to image plane, with marginal rays from an on-axis field point shown.
Figure 3:
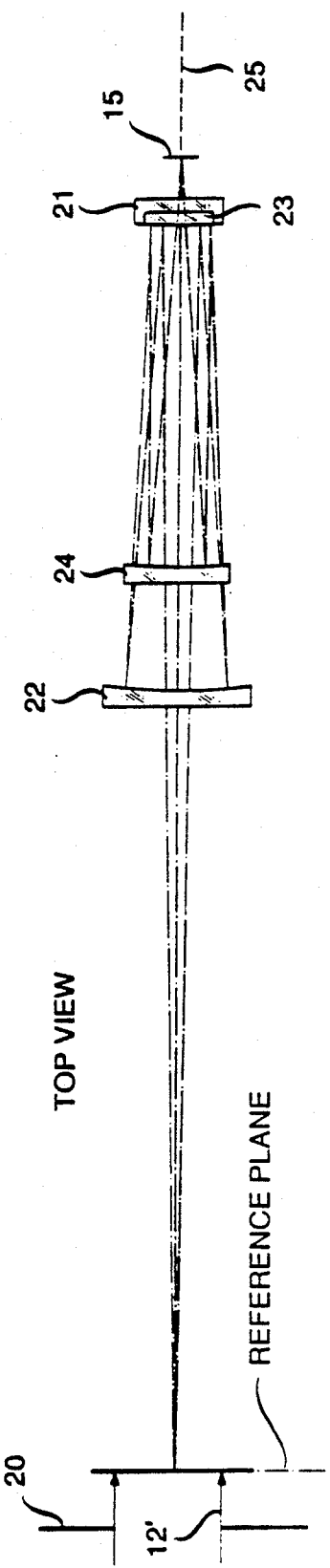

Relevant parts of an exemplary, and currently preferred, embodiment of the X-ray projection system according to the invention are schematically shown in side and top view in FIGS. 2 and 3, respectively. Both figures show process radiation beam 12' incident on mask 14, with optional aperture 20 limiting the beam size. FIG. 2 shows the radiation diverging from the mask onto primary mirror 21, a convex off-axis aspheric mirror section. The radiation received by 21 is reflected in a diverging pattern onto secondary mirror 22, a concave spherical mirror. From 22 the radiation is reflected in a converging pattern upon the convex surface of tertiary mirror 23. In the currently preferred embodiment the tertiary mirror is weakly aspheric, but optionally could be spherical for some applications. The tertiary mirror defines the aperture stop of the system. From 23 the radiation is reflected in a diverging pattern upon quaternary mirror 24, a concave off-axis aspheric. The curvature and location of 24 are chosen such that radiation reflected off 24 is telecentric in image space.

In FIG. 2 is also shown the coordinate system that is used in the description of the invention. The z-axis is parallel to reference axis 25 (which in turn is centered in, and normal to, the irradiated portion of mask 14), and the x- and y-axes are parallel to the mask. From FIG. 3 it is apparent that the projection system is symmetrical about the yz-plane.

As shown, the inventive projection system is off-axis in the aperture and the image field, i.e., the system does not have an axis of rotational symmetry. Furthermore, it is an all reflective, unobscured, finite conjugate (i.e., the object is not at infinity) system adapted to form a flat X-ray image of a flat mask. The image can be diffraction-limited, with high resolution over the image field. The image field is two-dimensional, with a and b designating the image field size in the two dimensions, with the axes of the image field selected such that a≧b. The field size can be such that b≳0.1a, and b≳1 mm. Exemplarily, both a and b are about 10 mm, the field thus being square or circular. However, rectangular, elliptical, or other field shapes are also possible and are contemplated.

In projection systems according to the invention, the mirror parameters can readily be chosen to cooperate to give a high degree of correction of spherical aberration, coma, astigmatism, and Petzval curvature. Distortion, i.e., the bulging in or out of the sides of an otherwise perfect square, can be limited to a residual of the order of 1%, which can be better corrected by pre- or post-processing of the imagery.

Typically, the resolution over the image field is better than 0.25 μm in inventive systems. In an exemplary system according to the invention the resolution is 0.1 μm over a field of size 10×10 mm square, and is 0.2 μm over a 25×25 mm square field if the system is scaled up by a factor of 2.5, so that the mask-wafer distance is increased to 1 m, all for process radiation of 13 nm.

Figure 4:
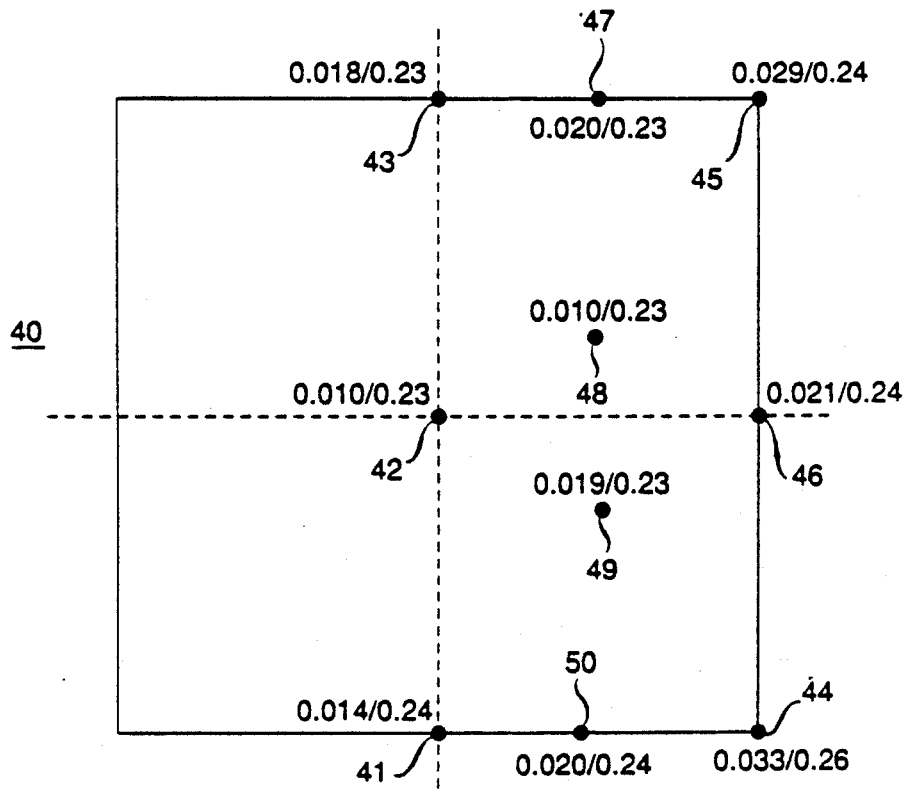
FIG. 4 gives, for an exemplary projection system according to the invention, the RMS wavefront error and the 84% encircled energy diameter (before tolerances) at several points on a square image format, at a wavelength of 13 nm.

FIGS. 4 and 5 show calculated performance data for the currently preferred embodiment of the inventive projection system, for wavelength of 13 nm. In particular, FIG. 4 shows the RMS wavefront error and the 84% encircled energy diameter at 9 points (reference numerals 41–50) in (10×10 mm) square image field 40. FIG. 5 shows ray aberration plots for five of the nine field points of FIG. 4, with FIG. 5A pertaining to point 41, 5B to 42, 5C to 43, 5D to 44, and 5E to 45, with the ordinate being in millimeters.

Tables I–V contain constructional data and other relevant information for the exemplary currently preferred projection system of FIGS. 2 and 3. This system is a 5:1, NA 0.08, 50×50 mm four mirror anastigmat. The reference wavelength is 13 nm. The information is presented in a form appropriate for use with known and widely available lens design software (exemplarily CODEV), as will be recognized by those skilled in the art. The terminology used is also well understood by those skilled in the art.

Table I shows mirror radii and spacings, and other relevant information.

TABLE I

| ELEMENT NUMBER | RADIUS OF CURVATURE | | THICKNESS | APERTURE DIAMETER | | GLASS |
|---|---|---|---|---|---|---|
| | FRONT | BACK | | FRONT | BACK | |
| OBJECT | INF | | 492.1004 | | | AIR |

TABLE I-continued

| ELEMENT NUMBER | RADIUS OF CURVATURE FRONT | BACK | THICKNESS | APERTURE DIAMETER FRONT | BACK | GLASS |
|---|---|---|---|---|---|---|
| | DECENTER(1) | | | | 15.3748 | |
| | DECENTER(2) | | −492.7594 | | | |
| | DECENTER(3) | | 384.4899 | | 347.6409 | |
| 1 | A(1) | | −138.1642 | | C-1 | REFL |
| | DECENTER(4) | | | | | |
| 2 | 251.3331 CC | | 138.6499 | | 51.0000 | REFL |
| | DECENTER(5) | | | | 16.0604 | |
| | | | 0.0028 | | | |
| | DECENTER(6) | | | | | |
| 3 | A(2) | | −105.6994 | | C-2 | REFL |
| | DECENTER(7) | | | | | |
| 4 | A(3) | | 119.9052 | | C-3 | REFL |
| IMAGE | INF | | | | 14.1309 | |
| | DECENTER(8) | | | | | |

NOTES
Positive radius indicates the center of curvature is to the right
Negative radius indicates the center of curvature is to the left
Dimensions are given in millimeters
Thickness is axial distance to next surface
Image diameter shown above is a paraxial value, it is not a ray traced value Table II gives data on the decentered apertures.

TABLE II

| APER-TURE | SHAPE | DIAMETER X | Y | DECENTER X | Y | ROTATION |
|---|---|---|---|---|---|---|
| C-1 | CIRCLE | 30.000 | 30.000 | 0.000 | −25.060 | 0.0 |
| C-2 | CIRCLE | 16.060 | 16.060 | 0.000 | 8.530 | 0.0 |
| C-3 | CIRCLE | 34.000 | 34.000 | 0.000 | 32.800 | 0.0 |

Aspheicity is defined by the following expression:

$$Z = \frac{(CURV)\, Y^2}{1 + (1 - (1 + K)(CURV)^2 Y^2)^{\frac{1}{2}}} + (A)Y^4 + (B)Y^6 + (C)Y^8 + (D)Y^{10}$$

Table III gives the values of the aspheric coefficients, and Table IV gives mirror decentering constants.

A decenter defines a new coordinate system (displaced and/or rotated) in which subsequent surfaces are defined. Surfaces following a decenter are aligned on the local mechanical axis (z-axis) of the new coordinate system. The new mechanical axis remains in use until changed by another decenter. The order in which displacements and tilts are applied on a given surface is specified using different decenter types, and these generate different new coordinate systems; those used here are explained below. Alpha, beta, and gamma are in degrees.

| TYPE | DECENTERING CONSTANT KEY: TRAILING CODE | ORDER OF APPLICATION |
|---|---|---|
| DECENTER | | DISPLACE (X, Y, Z) TILT (ALPHA, BETA, GAMMA) REFRACT AT SURFACE THICKNESS TO NEXT SURFACE |
| DECENTER & RETURN | RETU | DECENTER (X, Y, Z, ALPHA, BETA, GAMMA) REFRACT AT SURFACE RETURN (-GAMMA, -BETA, -ALPHA, -Z, -Y, -X) THICKNESS TO NEXT SURFACE |

TABLE III

| ASPHERIC | CURV | K | A | B | C | D |
|---|---|---|---|---|---|---|
| A(1) | 0.00470210 | 0.094913 | −1.18605E − 09 | −2.90324E − 13 | −1.64799E − 17 | 0.00000E + 00 |
| A(2) | 0.00410683 | 1.286377 | −5.29288E − 09 | −1.17966E − 12 | 5.27470E − 18 | 0.00000E + 00 |
| A(3) | 0.00484125 | 0.110834 | −1.17939E − 10 | −5.83499E − 14 | −3.91902E − 19 | 0.00000E + 00 |

TABLE IV

| DECENTER | X | Y | Z | ALPHA | BETA | GAMMA | |
|---|---|---|---|---|---|---|---|
| D(1) | 0.0000 | 50.5604 | 0.0000 | 0.0000 | 0.0000 | 0.0000 | |
| D(2) | 0.0000 | 138.1969 | 0.0000 | −10.7651 | 0.0000 | 0.0000 | |
| D(3) | 0.0000 | −3.1043 | 0.0000 | 0.8271 | 0.0000 | 0.0000 | (RETU) |
| D(4) | 0.0000 | −24.6204 | 0.0000 | 5.4190 | 0.0000 | 0.0000 | (RETU) |
| D(5) | 0.0000 | 5.5596 | 0.0000 | 0.0000 | 0.0000 | 0.0000 | (RETU) |
| D(6) | 0.0000 | −2.9770 | 0.0000 | 1.0235 | 0.0000 | 0.0000 | (RETU) |
| D(7) | 0.000 | −1.0873 | 0.0000 | 0.0038 | 0.0000 | 0.0000 | (RETU) |
| D(8) | 0.0000 | 23.4328 | 0.0000 | −1.4196 | 0.0000 | 0.0000 | (RETU) |

Finally, Table V gives first order data on the exemplary system, which is a decentered system. If elements with power are decentered or tilted, the first order properties frequently will not be adequate to describe the system characteristics. Focal lengths, including the system focal length of the exemplary projection system (EFL), are given in Table V. As those skilled in the art know, system focal length is a design parameter that depends on the radii and spacings of the mirrors. Thus, if the above parameters have been selected the system designer can determine EFL in a known manner.

TABLE V

|  | POS. 1 |
| --- | --- |
| INFINITE CONJUGATES |  |
| EFL = | 96.8860 |
| BFL = | 101.9331 |
| FFL = | 10.5004 |
| F/NO = | 6.3826 |
| AT USED CONJUGATES |  |
| REDUCTION = | 0.1928 |
| FINITE F/NO = | 6.2500 |
| OBJECT DIST = | 492.1004 |
| TOTAL TRACK = | 398.5251 |
| IMAGE DIST = | 119.9052 |
| OAL = | −213.4805 |
| PARAXIAL |  |
| IMAGE HT = | 4.8192 |
| IMAGE DIST = | 120.6098 |
| SEMI-FIELD ANGLE = | 7.2944 |
| ENTR PUPIL |  |
| DIAMETER = | 15.1797 |
| DISTANCE = | 0.0000 |
| EXIT PUPIL |  |
| DIAMETER = | 140.0615 |
| DISTANCE = | 995.8899 |
| APER STOP DIAMETER = | 15.3253 |

NOTES
FFL is measured from the first surface
BFL is measured from the last surface Mirrors that can have relatively high reflectivity in the spectral range of interest are known. See, for instance, J. A. Trail et al., *Applied Physics Letters*, Vol. 52, p. 269 (1988), which discloses a mirror comprising 62 Si/Mo layer pairs that can provide more than 50% reflectivity at 15 nm. See also H. Kinoshita et al., "Soft X-ray reduction lithography using multilayer mirrors", presented at the 33rd International Symposium on Electron, Ion, and Photon Beams, Monterey, Calif., 1989, which, inter alia, gives reflectivity data for Ni/C and Mo/Si multilayer structures, and concludes that the latter can have 65% reflectivity and 0.5 nm bandwidth at about 13 nm. A. M. Hawryluk et al., *Journal of Vacuum Science and Technology*, Vol. B6, p. 2162 (1988), discloses a lithography system that comprises a 2-mirror X-ray reduction camera that uses a reflective mask (such a mask is essentially a patterned, highly dispersive multilayer mirror) and multilayer spherical mirrors. See also E. Spiller, *American Institute of Physics*, Proceedings No. 75, "Low Energy X-ray Diagnostics", 1981, pp. 124–130.

In view of the fact that mirrors for the spectral range of interest herein are not expected to exceed about 75% reflectivity, it will typically be advantageous to limit the number of mirrors used in systems according to the invention to 4, the minimum number required, or perhaps to 5. Designs requiring more mirrors that 5 will typically require unacceptably long exposure times and/or very high intensity (and therefore more costly) X-ray sources.

Figure 6:
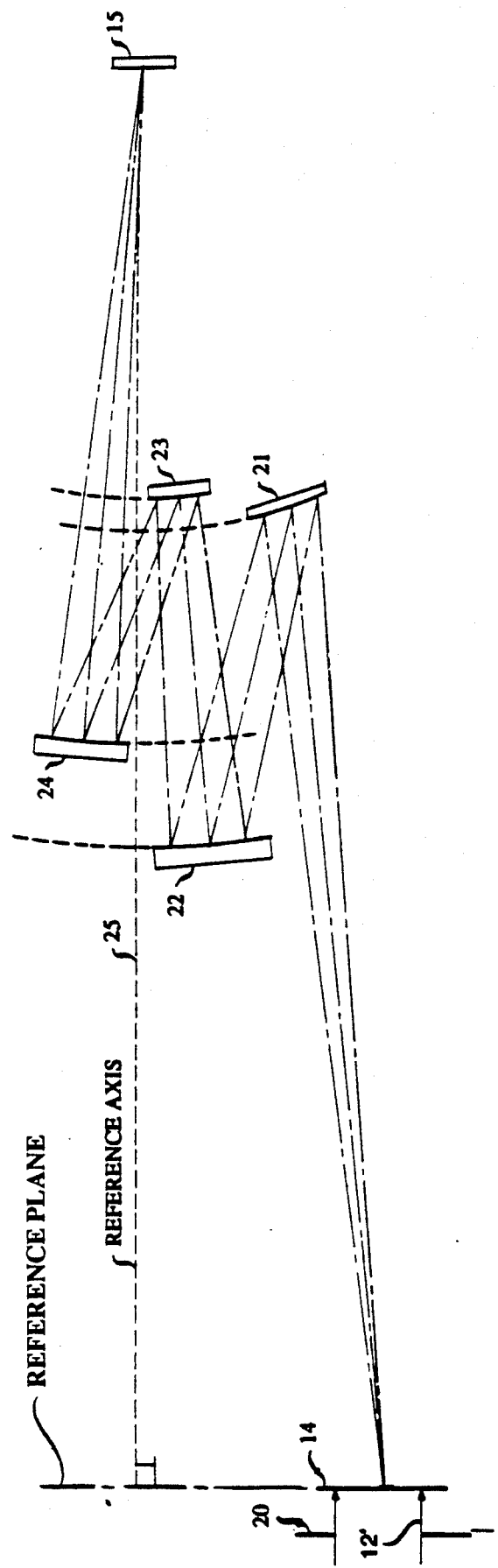
FIG. 6 schematically depicts the relevant parts of a further exemplary projection system according to the invention, namely, a co-axial system.

In many cases it will be advantageous to embody the invention in apparatus that comprises projection system means having a co-axial mirror arrangement, since such a projection system is typically easier to assemble, align and test than a system with a non-coaxial mirror arrangement. An exemplary embodiment of such a system, a coaxial four mirror anastigmat, is shown in FIG. 6. The centers of curvature of all four mirrors lie on a common axis which is normal to both the object and image planes. In addition, all parent aspherics have no tilt or decenter with respect to the common axis. The projection system thus may be viewed as a rotationally symmetric system used with eccentric aperture stop (on the tertiary mirror 23) and off-axis field. This symmetry makes possible designs with very low residual distortion, e.g., 0.7 μm for a 5×10 mm field. Such low distortion can readily be corrected by predistortion of the mask.

Figure 7:
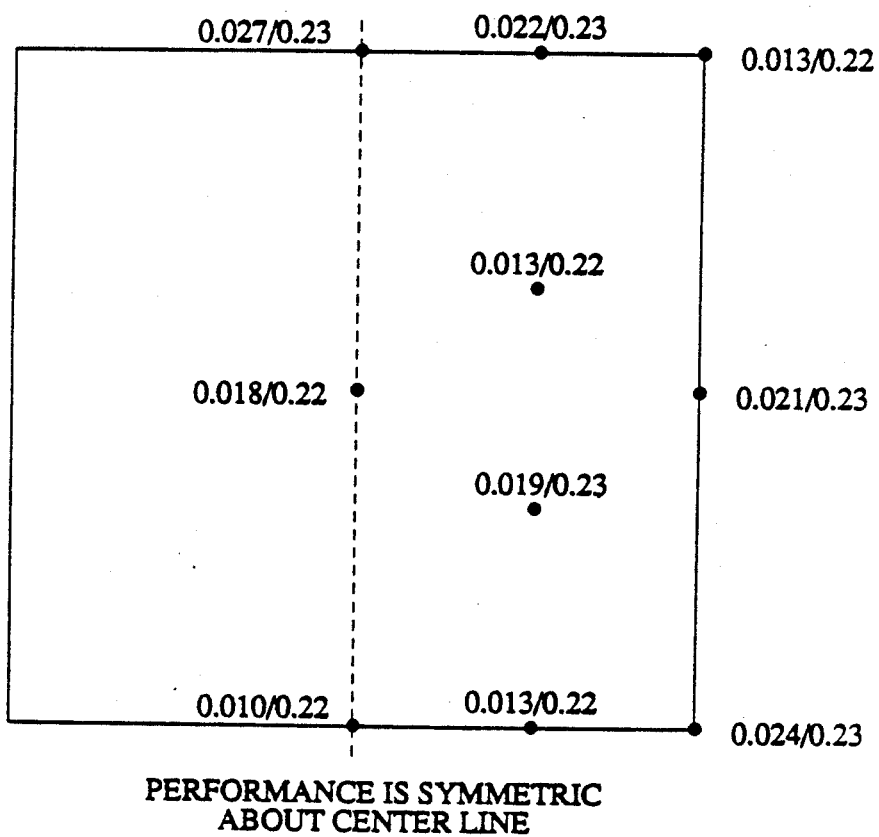
FIGS. 7 and 8 give performance data for two exemplary co-axial projection systems according to the invention.

A particular design of the coaxial projection system of FIG. 6 in which all four mirrors are aspherics (with two being conic surfaces and the others being conics plus 6th order departures, with maximum aspheric departure from the best fit sphere over the used mirror portions being 3.6 μm) has the following characteristics: For a field of 5×10 mm on the wafer side and 0.08 NA, at 13 nm the maximum residual RMS wavefront error is 0.027 waves (0.018 waves average), with minimum square wave MTF value of 0.61 at 5000 lines/mm. The exemplary system has mask-to-wafer distance of 500 mm, and is essentially telecentric in the image space, with maximum non-telecentricity error 0.005 μm per 1 μm defocus. Exemplary data on the performance of the above discussed 5×10 mm design, analogous to that shown in FIG. 4, is shown in FIG. 7.

The exemplary system comprises, from long to short conjugate, a first convex, a first concave, a second convex and a second concave mirror, and has a system focal length (EFL) of 150.0583 mm. The radii absolute values of the four mirrors are, again from long to short conjugate and as a fraction of EFL, 2.612, 2.987, 1.671 and 1.563, all to within ±5%. Equivalently, the radii of the four mirrors are, in the same order, in the ratio of 1.00, 1.14, 0.64, and 0.598, also all to within ±5%. The axial separations of the mirrors, as a fraction of EFL, are 1.845 (first convex to first concave), 1.926 (first concave to second convex), 0.862 (second convex to second concave), and 1.042 (second concave mirror to image), all to within ±10%. As in the previously described exemplary system, departure from the recited values by more than the indicated percentage values will in general result in a system that fails to meet one or more of the indicated performance criteria.

Tables VI to IX present further constructional data and other relevant information on the above referred to exemplary 5×10 mm co-axial projection system, with Table VI providing data analogous to that of Table I, Table VII analogous to that of Table III, Table VIII analogous to that of Table IV, and Table IX analogous to that of Table V. The notes that pertain to any of Tables I-V also pertain to the analogous one of Tables VI-IX. The reference wavelength is 13 nm.

TABLE VI

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
| --- | --- | --- | --- | --- | --- | --- |
| OBJECT | INF | | 460.7807 | | | |
| 1 | A(1) | | −276.9094 | | 102.0000 | REFL |
| 2 | A(2) | | 289.2205 | | 144.0000 | REFL |
| | DECENTER(1) | | | | | |
| | | | APERTURE STOP −0.1432 | | 17.9239 | |
| 3 | A(3) | | −129.3603 | | 35.6000 | REFL |
| 4 | A(4) | | 156.4125 | | 110.0000 | REFL |
| IMAGE | INF | | | | 53.9657 | |

TABLE VII

| ASPHERIC | CURV | K | A | B | C | D |
| --- | --- | --- | --- | --- | --- | --- |
| A(1) | 0.00255089 | −1.752716 | 0.00000E + 00 | −1.55889E − 14 | 0.00000E + 00 | 0.00000E + 00 |
| A(2) | 0.00223108 | −0.094390 | | | | |
| A(3) | 0.00398695 | 1.069510 | 0.00000E + 00 | −4.36798E − 13 | 0.00000E + 00 | 0.00000E + 00 |
| A(4) | 0.00426317 | 0.180827 | | | | |

TABLE VIII

| | DECENTERING CONSTANTS | | | | | | |
| --- | --- | --- | --- | --- | --- | --- | --- |
| DECENTER | X | Y | Z | ALPHA | BETA | GAMMA | |
| D(1) | 0.0000 | 8.4717 | 0.0000 | 0.0000 | 0.0000 | 0.0000 | (RETU) |

TABLE IX

| INFINITE CONJUGATES | |
| --- | --- |
| EFL = | 150.0583 |
| BFL = | 126.4031 |
| FFL = | 289.2315 |
| F/NO = | 6.4177 |
| AT USED CONJUGATES | |
| REDUCTION = | 0.2001 |
| FINITE F/NO = | 6.2500 |
| OBJECT DIST = | 460.7807 |
| TOTAL TRACK = | 500.0009 |
| IMAGE DIST = | 156.4125 |
| OAL = | −117.1924 |
| PARAXIAL | |
| IMAGE HT = | 26.5262 |
| IMAGE DIST = | 156.4259 |
| SEMI-FIELD ANGLE = | 11.0414 |
| ENTR PUPIL | |
| DIAMETER = | 23.3820 |
| DISTANCE = | 269.5411 |
| EXIT PUPIL | |
| DIAMETER = | 178.1913 |
| DISTANCE = | 1269.9788 |

Figure 8:
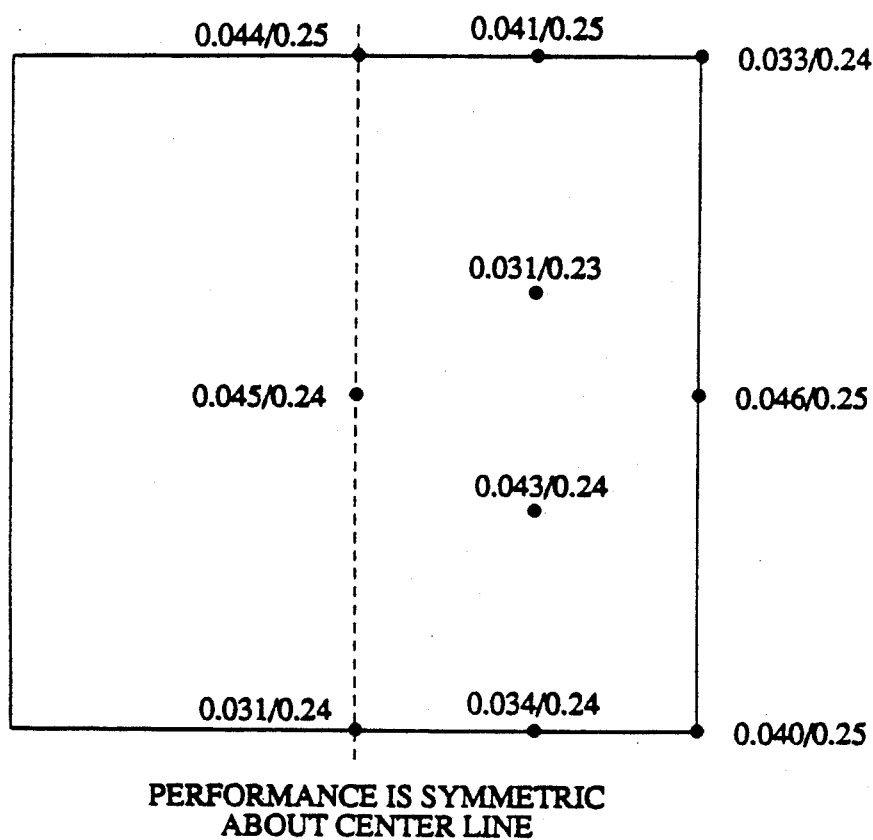

A further design of the co-axial projection system of FIG. 6 has diffraction limited performance over a 10 × 15 mm field size at the wafer, but has a somewhat larger envelope than the above described 5 × 10 mm design. Exemplarily, the mask-to-wafer distance is 880 mm. The distortion is below 1 $\mu$m, and the maximum RMS wavefront error is 0.053 $\mu$m (0.039 $\mu$m average). Minimum square wave MTF value at 5000 lines/mm is 0.54 (0.59 average), so 0.1 $\mu$m resolution may be achieved with reduced depth of focus. All mirrors are conic surfaces, with 6th and 8th order terms added. The maximum aspheric departure from the best fit sphere over the used portion of any mirror is 6.6 $\mu$m. FIG. 8 shows exemplary performance data, analogous to that of FIGS. 4 and 7.

We claim:

1. Apparatus adapted for semiconductor lithography comprising (a) means for holding an essentially flat mask member, the mask member to be exposed to process radiation during at least part of the time the apparatus is used, (b) means for holding a semiconductor member in predetermined relationship with respect to the mask member, and (c) projection system means adapted for forming a reduced size process radiation image of a predetermined region of the mask member on a surface of the semiconductor member, or on a processing layer disposed on the surface of the semiconductor member, characterized in that (d) the projection system means are adapted for use with process radiation of wavelength below about 30 nm;

(e) associated with the projection system means is an image field and a resolution over the image field, the image field having two dimensions, designated a and b, with a $\geq$ b, b $\gtrsim$ 0.1a, and b $\gtrsim$ 5 mm; and the resolution over the image field is higher than about 0.25 $\mu$m; and (f) the projection system means contains four, and only four, curved mirrors for the process radiation that form a finite conjugate "optical" system that is telecentric at the short conjugate, the curved mirrors being, from long to short conjugate, a first convex, a first concave, a second convex and a second concave mirror, the mirrors selected such that the image of the predetermined region of the mask member is an essentially flat, diffraction limited image.

2. Apparatus of claim 1, wherein the image reduction is at least 2:1, wherein the resolution over the image field is higher than 0.2 $\mu$m, and wherein the "optical" system has a numerical aperture at the short conjugate of at least 0.07.

3. Apparatus of claim 1, wherein at least two of said curved mirrors are aspheric mirrors; the radii absolute values of said four curved mirrors being, from long to short conjugate and as a fraction of the system focal length, 2.20, 2.59, 2.51, and 2.13, all to within ±5%; the radii of said four mirrors being, from long to short conjugate, in the ratio of 1.00, 1.18, 1.14, and 0.97, all to with ±5%; with the axial separation, as a fraction of the system focal length, being 1.45 (first convex to first concave mirror), 1.47 (first concave to second convex mirror), 1.10 (second convex to second concave mirror), and 1.21 (second concave mirror to image), all to within ±10%, and wherein the "optical" system has a numerical aperture at the short conjugate of at least 0.07.

4. Apparatus of claim 1, further comprising a source of process radiation.

5. Apparatus of claim 1, wherein associated with each mirror is a center of curvature, and the mirrors are located such that all centers of curvature essentially lie on a given axis, associated with the apparatus being an object plane and an image plane, with the object plane and the image plane being perpendicular to said axis.

6. Apparatus of claim 5, wherein all four of said curved mirrors are aspheric mirrors, the radii absolute values of said four mirrors being, from long to short conjugate and as a fraction of the system focal length, 2.612, 2.987, 1.671, and 1.563, all to within ±5%; the radii of said four mirrors being, from long to short conjugate, in the ratio of 1.00, 1.14, 0.64, and 0.598, all to within ±5%; with the axial separation, as a fraction of the system focal length, being 1.845 (first convex to first concave mirror), 1.926 (first concave to second convex mirror), 0.862 (second convex to second concave mirror), and 1.042 (second concave mirror to image), all to within ±10%, and wherein the optical system has a numerical aperture at the short conjugate of at least 0.07.

* * * * *